(12) United States Patent
Itou et al.

(10) Patent No.: US 12,500,083 B2
(45) Date of Patent: Dec. 16, 2025

(54) WIRING SUBSTRATE, ELECTRONIC DEVICE, AND ELECTRONIC MODULE

(71) Applicant: KYOCERA Corporation, Kyoto (JP)

(72) Inventors: Seiichirou Itou, Kyoto (JP); Yuichiro Ishizaki, Kyoto (JP); Haruki Umeki, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 826 days.

(21) Appl. No.: 17/771,042

(22) PCT Filed: Oct. 30, 2020

(86) PCT No.: PCT/JP2020/040774
§ 371 (c)(1),
(2) Date: Apr. 22, 2022

(87) PCT Pub. No.: WO2021/085587
PCT Pub. Date: May 6, 2021

(65) Prior Publication Data
US 2022/0367183 A1 Nov. 17, 2022

(30) Foreign Application Priority Data

Oct. 31, 2019 (JP) ................................. 2019-198472
Mar. 30, 2020 (JP) ................................. 2020-059294

(51) Int. Cl.
*H01L 21/02* (2006.01)
*H10D 62/40* (2025.01)
*H10D 62/832* (2025.01)

(52) U.S. Cl.
CPC .. *H01L 21/02433* (2013.01); *H01L 21/02378* (2013.01); *H01L 21/0262* (2013.01); *H10D 62/405* (2025.01); *H10D 62/8325* (2025.01)

(58) Field of Classification Search
CPC ... H01L 29/04; H01L 29/045; H01L 29/0696; H01L 29/086; H01L 29/0878; H01L 29/402; H01L 29/825; H01L 29/1608; H01L 29/4236; H01L 29/4238; H01L 29/6606; H01L 29/7813; H01L 29/7835;
(Continued)

(56) References Cited

U.S. PATENT DOCUMENTS 5,977,564 A * 11/1999 Kobayashi .......... H01L 29/7813
257/E29.081
6,794,684 B2 * 9/2004 Slater, Jr. ........... A61K 40/4214
257/E33.068
(Continued)

FOREIGN PATENT DOCUMENTS

EP          0219933 A2     4/1987
JP          2019-062212 A  4/2019
WO          2016/017319 A1 2/2016

*Primary Examiner* — Timothy J. Dole
(74) *Attorney, Agent, or Firm* — Volpe Koenig (57) ABSTRACT

A wiring substrate includes an insulating substrate including a first surface and a wiring conductor located at the insulating substrate, the insulating substrate containing multiple bulk crystallites of SiC with different polytypes. An electronic device includes the wiring substrate described above and an electronic component mounted on the wiring substrate. An electronic module includes the electronic device described above and a module substrate on which the electronic device is mounted.

12 Claims, 8 Drawing Sheets

(58) Field of Classification Search
CPC ......... H01L 29/66068; H01L 29/66659; H01L 29/66704; H01L 21/046; H01L 21/0242; H01L 21/0262; H01L 21/0485; H01L 21/02378; H01L 21/02433; H01L 21/02447; H01L 21/02529; H01L 21/02598; H01L 21/02609; H01L 21/78; H01L 21/268; H01L 21/6836; H01L 21/7813; H05K 5/10; H10D 62/53; H10D 62/117; H10D 62/235; H10D 62/393; H10D 62/405; H10D 62/8325
USPC .......... 361/748; 117/3, 84, 93, 94, 105, 108, 117/109; 257/18, 77, 91, 99, 103, 194; 423/275, 345; 438/458
See application file for complete search history.

(56) References Cited

U.S. PATENT DOCUMENTS

| | | | | |
|---|---|---|---|---|
| 6,995,396 | B2* | 2/2006 | Takahashi | H01L 21/02584 257/280 |
| 7,449,065 | B1* | 11/2008 | Powell | C30B 29/36 117/109 |
| 10,157,898 | B2* | 12/2018 | Negley | H10H 29/142 |
| 10,611,052 | B1* | 4/2020 | Bubel | B28D 5/0011 |
| 11,557,674 | B2* | 1/2023 | Marui | H01L 29/66704 |
| 2002/0096106 | A1* | 7/2002 | Kub | H01L 21/2007 117/94 |
| 2006/0278892 | A1* | 12/2006 | Harris | H10D 30/4732 257/E29.249 |
| 2008/0190355 | A1* | 8/2008 | Chen | C30B 29/36 257/E29.104 |
| 2013/0309496 | A1* | 11/2013 | Zwieback | C30B 29/36 428/402 |
| 2013/0320275 | A1* | 12/2013 | Zwieback | H01B 3/025 117/84 |
| 2014/0234194 | A1* | 8/2014 | Zwieback | C30B 23/02 118/726 |
| 2014/0264374 | A1* | 9/2014 | Hecht | H01L 21/76254 257/77 |
| 2014/0321491 | A1 | 10/2014 | Sakata et al. | |
| 2016/0322219 | A1* | 11/2016 | Imaoka | H01L 21/02598 |
| 2017/0012102 | A1* | 1/2017 | Konrath | H01L 21/046 |
| 2018/0047856 | A1* | 2/2018 | Cai | H01L 31/028 |
| 2018/0343704 | A1* | 11/2018 | Lee | H05B 3/141 |
| 2019/0140092 | A1* | 5/2019 | Utsumi | H01L 29/086 |
| 2019/0194822 | A1* | 6/2019 | Kindaichi | C30B 23/02 |
| 2019/0296141 | A1* | 9/2019 | Rupp | H10D 62/53 |
| 2020/0135565 | A1* | 4/2020 | Bhalla | H01L 24/98 |
| 2020/0144053 | A1* | 5/2020 | Hamano | H01L 21/02447 |
| 2021/0017092 | A1* | 1/2021 | Guercio | C23C 16/045 |
| 2021/0069926 | A1* | 3/2021 | Fuji | H01L 21/268 |
| 2021/0233994 | A1* | 7/2021 | Nakano | H01L 29/0619 |
| 2021/0234007 | A1* | 7/2021 | Ueno | H01L 29/7813 |
| 2021/0296448 | A1* | 9/2021 | Kawakami | H01L 29/04 |
| 2022/0028976 | A1* | 1/2022 | Wirths | H10D 62/8325 |

* cited by examiner

WIRING SUBSTRATE, ELECTRONIC DEVICE, AND ELECTRONIC MODULE

TECHNICAL FIELD

The present disclosure relates to a wiring substrate, an electronic device, and an electronic module.

BACKGROUND

To mount an electronic component on a package or a module substrate, there is a wiring substrate interposed between the electronic component and the package or between the electronic component and the module substrate. Japanese Unexamined Patent Application Publication No. 2019-62212 discloses a semiconductor laser device including a wiring substrate of single-crystal SiC (silicon carbide).

Although single-crystal SiC substrates have high heat dissipation performance, their production costs are high.

SUMMARY

A wiring substrate according to the present disclosure includes:
  an insulating substrate including a first surface, and
  a wiring conductor located at the insulating substrate,
  the insulating substrate containing multiple bulk crystallites of SiC with different polytypes.
An electronic device according to the present disclosure includes:
  the wiring substrate described above, and an electronic component mounted on the wiring substrate.
An electronic module according to the present disclosure includes:
  the electronic device described above, and
  a module substrate on which the electronic device is mounted.

DETAILED DESCRIPTION

Embodiments of the present disclosure will be described in detail below with reference to the drawings.

First Embodiment

Figure 1:
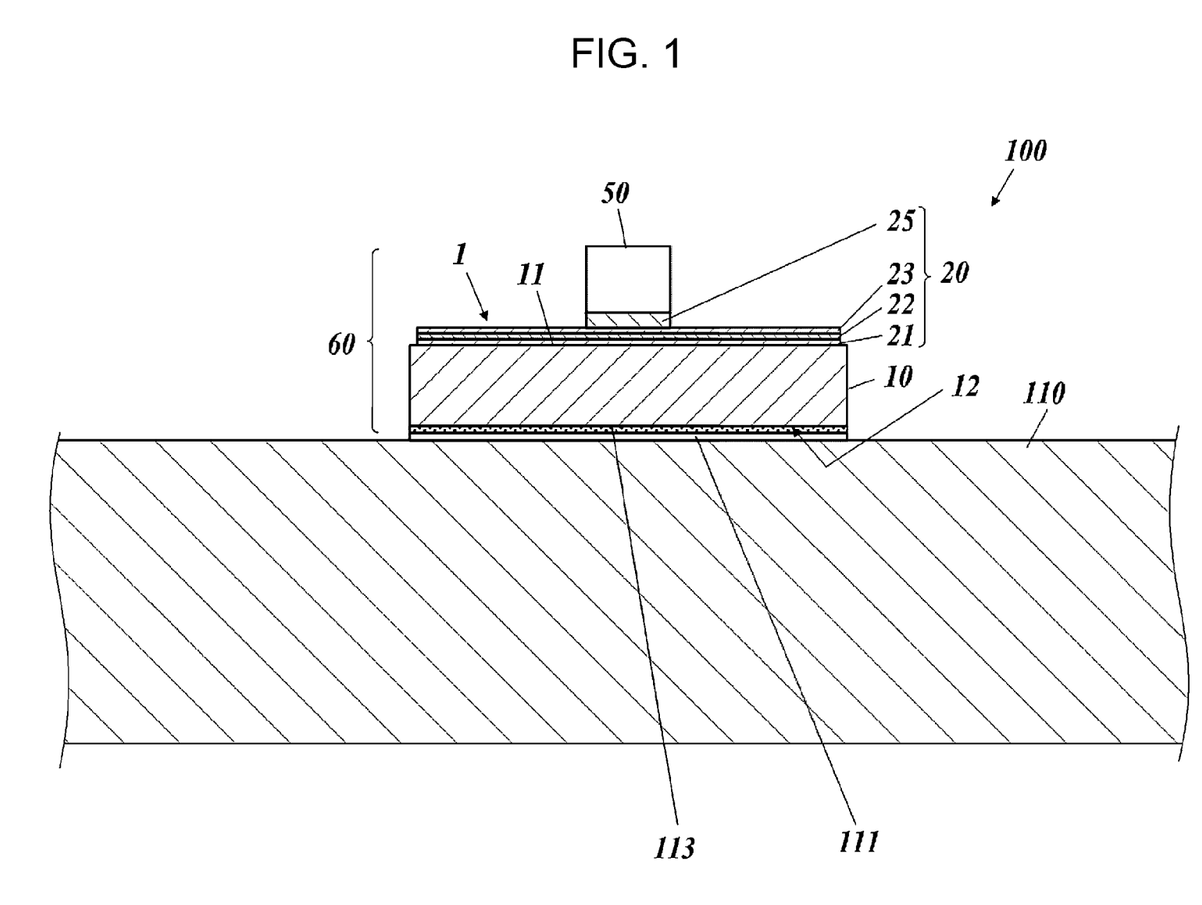
FIG. 1 illustrates an electronic device including a wiring substrate and an electronic module according to a first embodiment of the present disclosure.

FIG. 1 illustrates an electronic device including a wiring substrate, and an electronic module according to a first embodiment of the present disclosure. The wiring substrate 1 according to the first embodiment includes an insulating substrate 10, which is a plate-like member, including a first surface 11, and a wiring conductor 20 located at the first surface 11 of the insulating substrate 10. The wiring substrate 1 includes a second surface 12 opposite to the first surface 11. The first surface 11 and the second surface 12 may be two wider surfaces of the plate-like member or may be ones on which electronic components are mounted. The wiring conductor 20 may be formed of a stack of an adhesion layer 21 composed mainly of, for example, Ti (titanium), Cr (chromium), or both Ti and Cr, a barrier layer 22 composed mainly of, for example, Pt (platinum), a conductor layer 23 composed mainly of, for example, Au (gold), and a bonding conductor 25, such as AuSn (gold-tin), that bonds an electronic component 50.

The wiring substrate 1 may be a submount that is interposed between an electronic component 50 and a package or between the electronic component 50 and a module substrate 110 and that is responsible for a heat removal effect and an electrical connection function for the electronic component 50. In the submount, the first surface 11 on which the electronic component 50 is mounted has a size of 0.01 cm$^2$ to 1.00 cm$^2$. The submount has a thickness of 0.1 mm to 0.8 mm.

Figure 2:
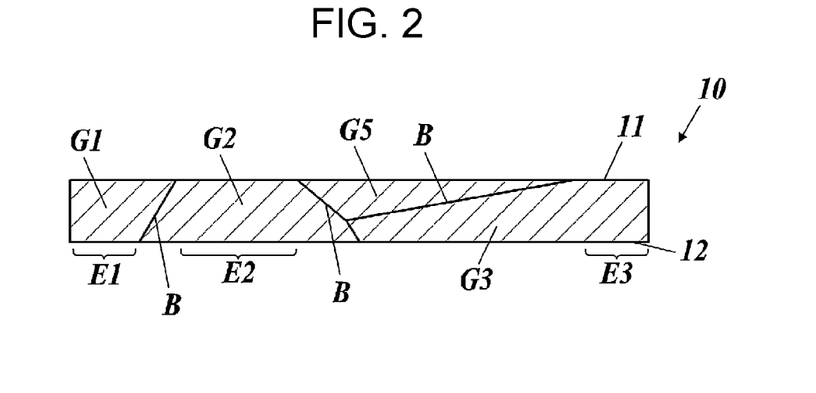
FIG. 2 is a longitudinal sectional view of an insulating substrate illustrated in FIG. 1.
Figure 3:
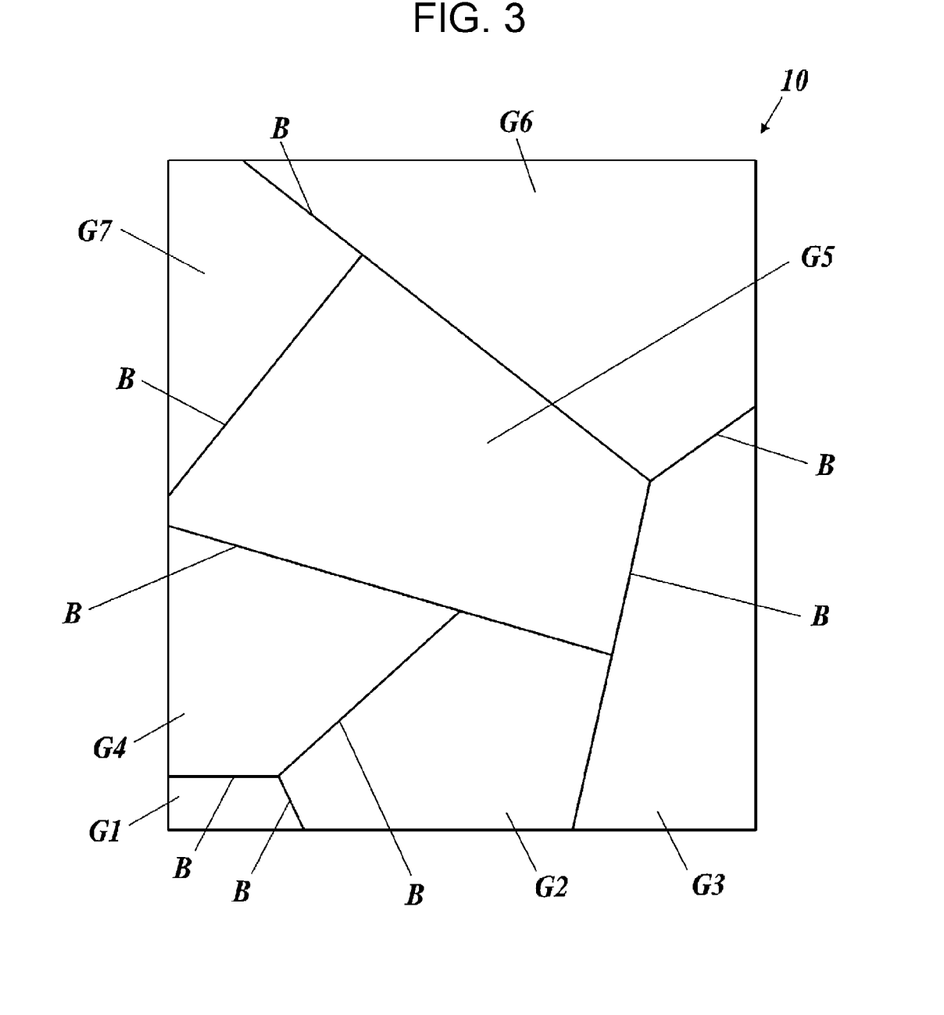
FIG. 3 is a plan view illustrating the insulating substrate illustrated in FIG. 1.

FIG. 2 is a longitudinal sectional view of the insulating substrate illustrated in FIG. 1. FIG. 3 is a plan view illustrating the insulating substrate illustrated in FIG. 1.

The insulating substrate 10 is a polycrystalline SiC substrate containing multiple bulk crystallites bonded together while undergoing crystal growth, and contains multiple bulk crystallites G1 to G7. The term "bulk crystallite" refers to a mass of a single crystal grown three-dimensionally. A grain boundary phase (for example, a phase containing a sintering aid for use in firing for a SiC multiparticle sintered substrate) is not contained between adjacent bulk crystallites. A grain boundary B as an interfacial boundary may be interposed therebetween. The term "phase" refers to a structure having a thickness even if it is minute.

The number of the bulk crystallites G1 to G7 contained in the first surface 11 of the insulating substrate 10 may be 2 pieces/cm$^2$ or more and 100 pieces/cm$^2$ or less. The number density of bulk crystallites as described above results in a thermal conductivity equivalent to that of a single-crystal SiC substrate. If the number density of the bulk crystallites is higher than 100 pieces/cm$^2$, the thermal conductivity is lower than that of the single-crystal SiC substrate. If the number density of the bulk crystallites is lower than 2 pieces/cm$^2$, the number of micropipes generated from grain boundaries due to crystal mismatch is increased, and the number of micropipes that penetrate from the first surface 11 to the second surface 12 is increased. With regard to the size of the bulk crystallites G1 to G7 contained in the first surface 11 of the insulating substrate 10, the minimum width may be 1 mm to 5 mm. The number of the bulk crystallites G1 to G7 contained in the first surface 11 may be 2 pieces/cm$^2$ or more and 10 pieces/cm$^2$ or less.

The insulating substrate 10 includes regions E1 to E3 (FIG. 2) where no grain boundaries are present between the first surface 11 and the second surface 12. In other words, the insulating substrate 10 includes the regions E1 to E3 each occupied by a single bulk crystallite from the first surface 11 to the second surface 12.

The grain boundary B-free regions E1, E2, and E3 may be superimposed on a region where the wiring conductor 20 is located in a perspective plan view of the first surface 11 (a perspective view of the insulating substrate 10 in a direction perpendicular to the first surface 11). A configuration may be used in which no grain boundary B is present at a position superimposed on the wiring conductor 20 in the perspective plan view of the first surface 11. In the insulating substrate 10, a region in which two or more grain boundaries B are contained between the first surface and the second surface 12 in the perspective view in the direction perpendicular to the first surface 11 may be 20% or less in area fraction.

Figure 4:
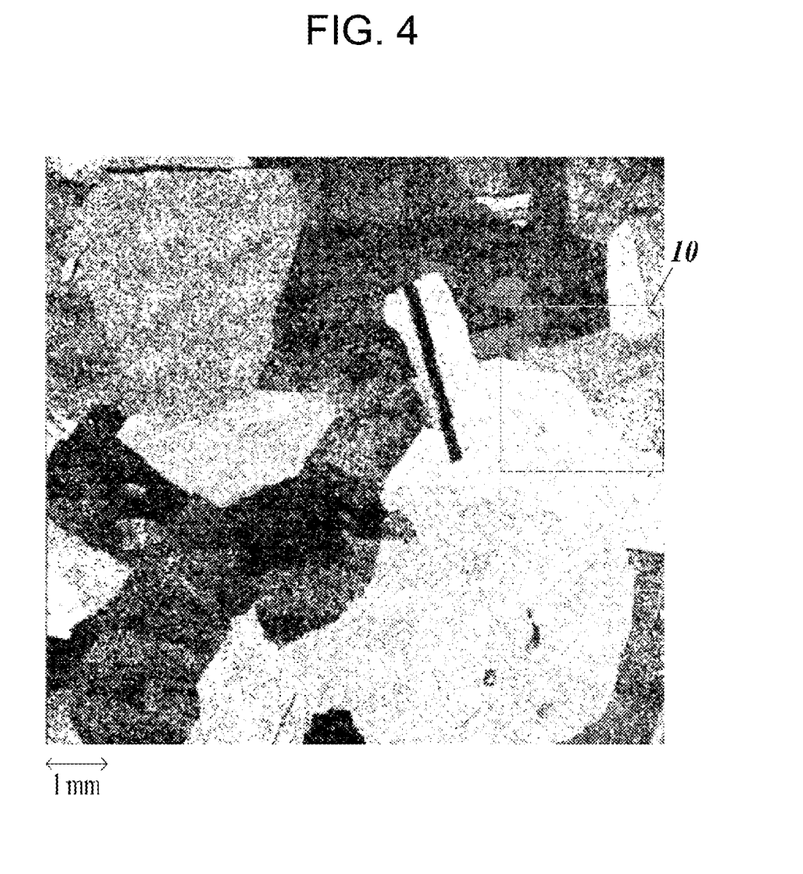
FIG. 4 is an image drawing of an electron micrograph of a surface of an insulating substrate.

FIG. 4 is an image drawing of an electron micrograph of a surface of an insulating substrate. The photograph in FIG. 4 has different lightness levels in accordance with the polytypes of the bulk crystallites.

As illustrated in FIG. 4, the wiring substrate 1 contains multiple bulk crystallites of SiC with different polytypes. The term "polytype" refers to the type of polymorphism in which the chemical composition is identical and the atomic arrangement of the crystals is different. The multiple bulk crystallites may all belong to α-SiC. α-SiC refers to bulk crystallites other than the 3C type and is a high-purity SiC crystal. α-SiC can be formed by crystal growth at 2,000° C. or higher using a sublimation-recrystallization method. With regard to all the bulk crystallites contained in the insulating substrate 10, any of 4H-type, 6H-type, and 15R-type bulk crystallites may be contained, and the total volume fraction of the 4H-type, 6H-type, and 15R-type bulk crystallites may be 80% or more. The volume fraction of the 3C-type bulk crystallites contained in the insulating substrate 10 may be 1% or less.

The multiple bulk crystallites may include those having different plane directions from each other. The term "plane direction" refers to the direction of a specific crystal plane. The bulk crystallites of different polytypes contained in the insulating substrate 10 may have different plane directions from each other. The multiple bulk crystallites of the same polytype contained in the insulating substrate 10 may have different plane directions from each other.

<Method for Producing Crystalline SiC Substrate>

Figure 5A:
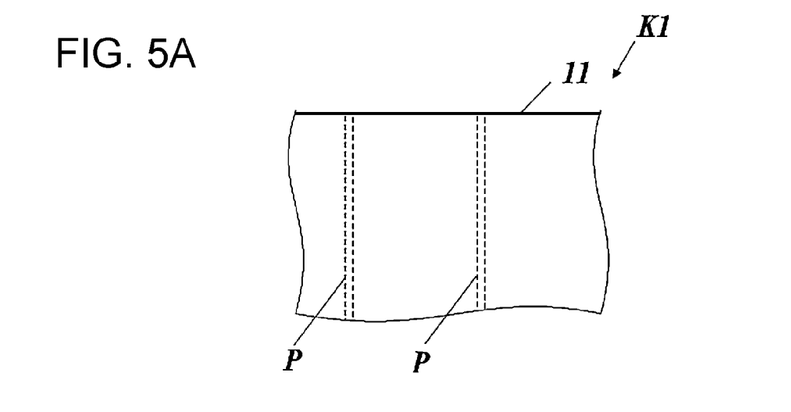
FIG. 5A illustrates a section of a single-crystal SiC substrate.
Figure 5B:
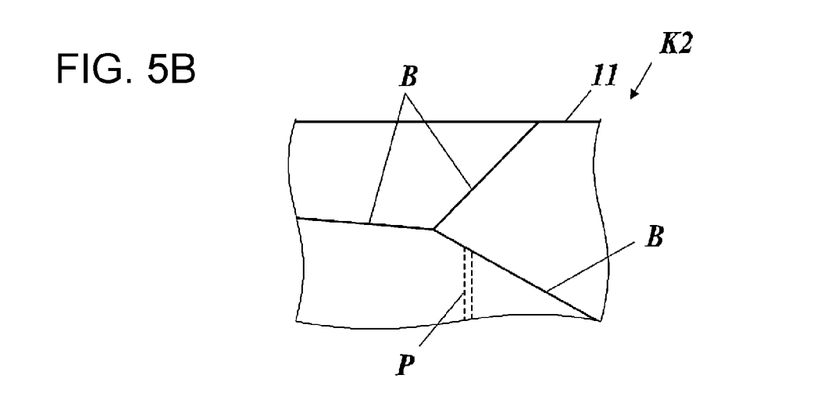
FIG. 5B illustrates a section of a crystalline SiC substrate according to the first embodiment.
Figure 5C:
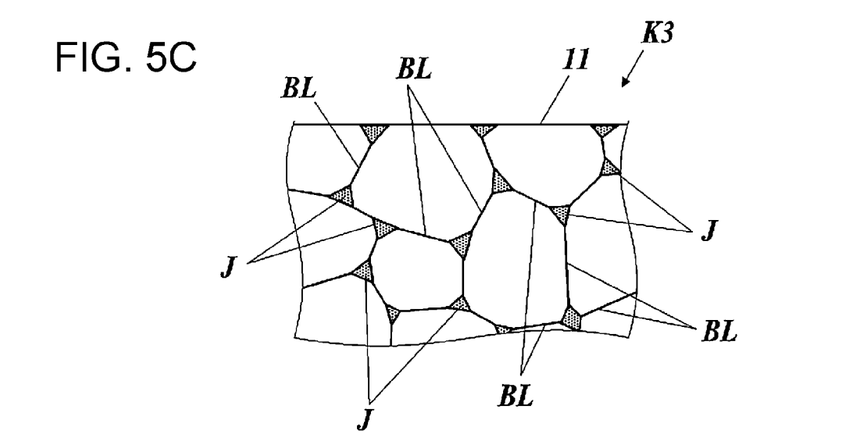
FIG. 5C illustrates a section of a SiC multiparticle sintered substrate.

FIGS. 5A to 5C illustrate three types of SiC substrates. FIG. 5A illustrates a section of a single-crystal SiC substrate. FIG. 5B illustrates a section of a crystalline SiC substrate according to the first embodiment. FIG. 5C illustrates a section of a SiC multiparticle sintered substrate.

There are several types of SiC substrates: for example, single-crystal SiC substrate K1 (FIG. 5A), which is made by single-crystal growth using the sublimation-recrystallization method; polycrystalline SiC substrate K2 (FIG. 5B), which is made by bonding multiple bulk crystallites while they are grown using the sublimation-recrystallization method; and SiC multiparticle sintered substrate K3 (FIG. 5C), which is made by grinding SiC crystals into fine particles and then sintering them through firing.

Single-crystal SiC substrate K1 has high thermal conductivity because it is a single crystal. Single-crystal SiC substrate K1 is anisotropic with respect to the thermal expansion coefficient and thus often contains micropipe P formed of a series of crystal defects during the crystal growth process. Micropipe P is often continuous from the first surface 11 of single-crystal SiC substrate K1 to the surface opposite to the first surface 11. The production cost of the single-crystal SiC substrate K1 is high due to a wide margin for production because a single-crystal portion is extracted and additionally due to the need for a seed crystal.

The polycrystalline SiC substrate K2 is obtained by growing SiC crystals using a physical vapor deposition method, such as the sublimation-recrystallization method, without a seed-crystal substrate or with a substrate containing multiple seed crystals. In the polycrystalline SiC substrate K2, during the growth of multiple bulk crystallites, adjacent bulk crystallites come into contact with each other to form bonded grain boundaries B. The polycrystalline SiC substrate K2 contains multiple bulk crystallites having different growth directions (i.e., plane directions) and thus contains the grain boundaries B having irregular orientations. If micropipes P are formed during the growth process of multiple bulk crystallites, the polycrystalline SiC substrate K2 contains multiple micropipes extending in different directions (central axis directions) because of the different plane directions of the multiple bulk crystallites. Since the grain boundaries B are formed if adjacent bulk crystallites come into contact with each other during the growth process, if the bulk crystallites contain micropipes, the end portions of the micropipes may be blocked by the adjacent bulk crystallites. In other words, during the crystal growth process, micropipes P with their end portions blocked by adjacent bulk crystallites may be formed. For the polycrystalline SiC substrate K2, there is no need to extract a single-crystal portion. Thus, the polycrystalline SiC substrate K2 can be produced at a lower cost than the single-crystal SiC substrate K1. The insulating substrate 10 of the first embodiment is obtained by cutting the polycrystalline SiC substrate K2 into a predetermined size.

The SiC multiparticle sintered substrate K3 is formed by gathering particles with a sintering aid, such as a binder, before firing, and sintering the particles together using the sintering aid. The sintering aid is a liquid phase and is, for example, alumina. The SiC multiparticle sintered substrate K3 contains a large number of fine grain boundaries BL and the remaining sintering aid J. Layer-like materials having thickness are contained in the grain boundaries BL in the SiC multiparticle sintered substrate K3. The SiC multiparticle sintered substrate K3 has a low thermal conductivity because thermal vibrations are diffused or absorbed by the many grain boundaries BL and the sintering aid J. The production process of the SiC multiparticle sintered substrate K3 does not include a crystal growth step.

<Micropipe>

Figure 6A:
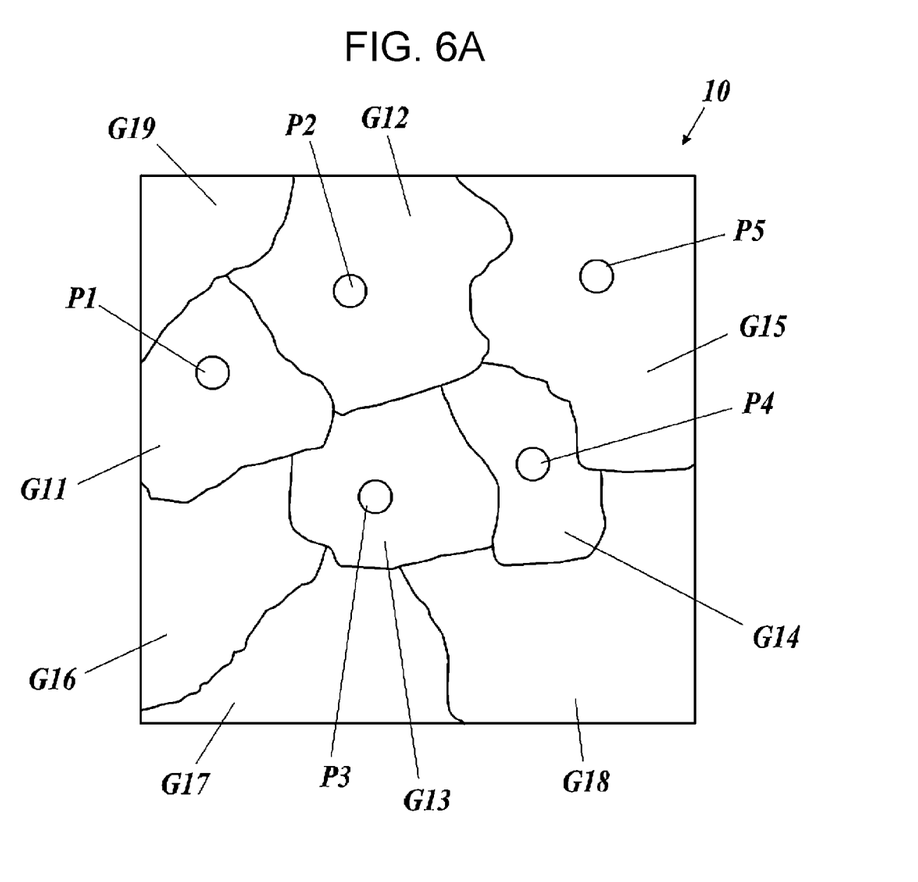
FIG. 6A is a plan view illustrating an example of micropipes contained in an insulating substrate according to the first embodiment.
Figure 6B:
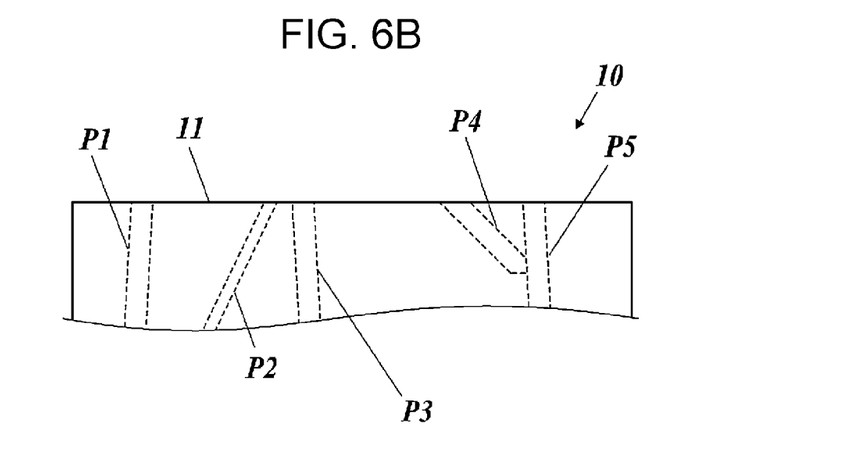
FIG. 6B is a side view of an example of micropipes contained in the insulating substrate according to the first embodiment.
Figure 7:
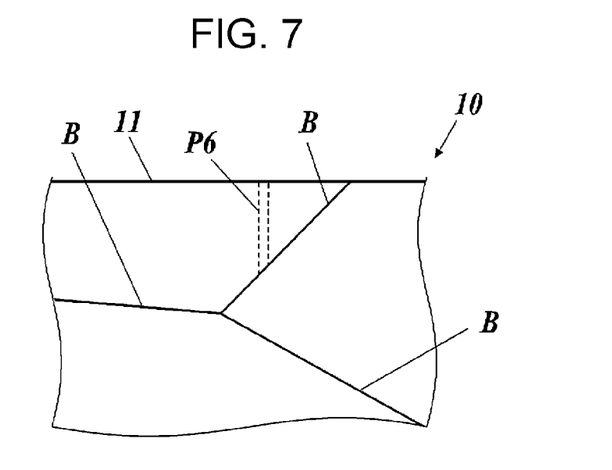
FIG. 7 is a side view illustrating an example of a micropipe contained in the insulating substrate according to the first embodiment.

FIG. 6A is a plan view illustrating an example of micropipes contained in the insulating substrate according to the first embodiment. FIG. 6B is a side view of an example of micropipes contained in the insulating substrate according to the first embodiment. FIG. 7 is a side view illustrating an example of a micropipe contained in the insulating substrate according to the first embodiment. FIGS. 6A, 6B and 7 illustrate an insulating substrate different from the insulating substrate 10 illustrated in FIGS. 2 and 3.

The insulating substrate 10 of the first embodiment is obtained by cutting the polycrystalline SiC substrate K2, as described above. Thus, as illustrated in FIGS. 6A and 6B, in some cases, multiple bulk crystallites G11 to G19 having different plane directions are contained, and, in addition, multiple micropipes P1 to P5 extending in different directions are contained. The micropipes P1 to P5 with first ends open to the first surface 11 have central axes inclined at various angles with respect to the first surface 11. As illustrated in FIG. 7, a micropipe P6 having a first end open to the first surface 11 and having a second end blocked by the grain boundary B is contained, in some cases.

Figure 8:
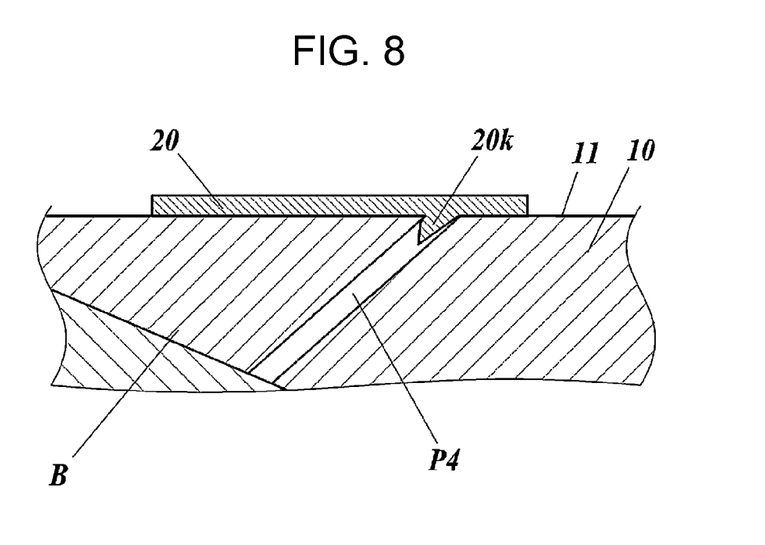
FIG. 8 illustrates the action of a micropipe contained in the insulating substrate according to the first embodiment.

FIG. 8 illustrates the action of a micropipe contained in the insulating substrate according to the first embodiment.

As illustrated in FIG. 8, in the insulating substrate 10 of the first embodiment, the micropipe P4 is open to the first surface 11 and extends obliquely with respect to the first surface 11. Accordingly, if the wiring conductor 20 is formed in the opening portion of the micropipe P4, the wiring conductor 20 extends partially in the micropipe P4. The diagonally extending portion 20k provides an anchoring effect and enables the film of the wiring conductor 20 to be less likely to peel off. Furthermore, the wiring conductor 20 is formed in the area where the multiple micropipes P1 to P5 are open, and extend in the end portions of the multiple micropipes P1 to P5. This provides the extended portions at different angles and enables the film of the wiring conductor 20 to be less likely to peel off.

Furthermore, in the insulating substrate 10 of the first embodiment, the micropipe P4 open to the first surface 11 is blocked at some midpoint by other bulk crystallites via the grain boundary B and does not reach the second surface 12, in many cases. This enables a high degree of insulation between the first surface 11 and the second surface 12.

<Resistivity>

The insulating substrate 10 may have a resistivity of $1\times10^3$ Ω·cm or more. The insulating substrate 10 may have a nitrogen content of $3\times10^{17}$ atoms/cm$^3$ (atomic number density) or less. The insulating substrate 10 may have a resistivity of $1\times10^5$ Ω·cm or more. The insulating substrate 10 may have a vanadium content of $1\times10^{15}$ atoms/cm$^3$ or more and $1\times10^{18}$ atoms/cm$^3$ or less.

As described above, in the SiC substrate, a reduction in the amount of nitrogen serving as a dopant and an increase in the amount of vanadium, which traps free electrons, enable the insulating substrate 10 to have an increased resistivity and enhanced insulation performance. In addition, the use of a vanadium content of lower than or equal to the foregoing level enables a reduction in the number of micropipes and suppression of the scattering effect of thermal vibrations, thereby maintaining a high thermal conductivity of the insulating substrate 10.

As described above, according to the wiring substrate 1 of the first embodiment, the multiple bulk crystallites G1 to G7 and G11 to G19 of SiC having different polytypes are contained. Thus, the production cost can be reduced because a single-crystal substrate is not used. In addition, the presence of the SiC bulk crystallites G1 to G7 and G11 to G19 in the insulating substrate 10 can provide the high thermal conductivity performance of the wiring substrate 1. Furthermore, higher thermal conductivity performance can be obtained by using the number of the bulk crystallites G1 to G7 and G11 to G19, per unit area, on the first surface 11, the grain boundary B-free regions E1 to E3 (FIG. 2), the positional relationship between the regions E1 to E3 and the wiring conductor 20, or two or more thereof.

According to the wiring substrate 1 of the first embodiment, the insulating substrate 10 includes the multiple bulk crystallites G1 to G7 and G11 to G19 having different plane directions. Accordingly, the anisotropy of the thermal expansion is reduced, and the amount of thermal deformation of the entire insulating substrate 10 is reduced, thereby enabling reductions in the distortion of the electronic component 50 and the stress between the insulating substrate 10 and the electronic component 50. In addition, a stress due to a difference in thermal expansion between the insulating substrate 10 and the wiring conductor 20 or a stress due to a difference in thermal expansion between the wiring substrate 1 and the electronic component 50 is isotropic, so that adverse effects caused by stress can be less likely to occur. Moreover, in the insulating substrate 10, the various plane directions result in isotropic properties in terms of thermal conductivity.

According to the wiring substrate 1 of the first embodiment, the SiC crystals of the insulating substrate 10 have the polytype fraction as described above, thus making it possible to achieve a higher thermal conductivity.

According to the wiring substrate 1 of the first embodiment, owing to the above-mentioned characteristics of the micropipes P1 to P6, the film of the wiring conductor 20 can be less likely to peel off. In addition, the micropipes P1 to P6 can be less likely to cause the effect of deteriorating the insulating properties. The high resistivity of the insulating substrate 10 itself can be achieved by the amount of the above-mentioned components contained in the insulating substrate 10. Accordingly, it is possible to improve the reliability of the wiring conductor 20 of the wiring substrate 1 and the insulation properties of the insulating substrate 10.

(Electronic Device and Electronic Module)

As illustrated in FIG. 1, an electronic device 60 of the first embodiment includes an electronic component 50 mounted on the wiring substrate 1. The electrodes of the electronic component 50 are electrically connected to the wiring conductor 20. An electrode of the electronic component 50 may be directly bonded to the wiring conductor 20 or may be connected thereto with a bonding member, such as a bonding wire provided therebetween. The electronic device 60 may include a package that receives the wiring substrate 1 and the electronic component 50.

Examples of the electronic component 50 that can be used include various electronic components, such as optical elements, e.g., laser diodes (LDs), photodiodes (PDs), and light-emitting diodes (LEDs), image-pickup elements of charge-coupled device (CCD) types and complementary metal oxide semiconductor (CMOS) types, piezoelectric oscillators, e.g., quartz oscillators, surface acoustic wave elements, semiconductor elements, e.g., semiconductor integrated circuits (ICs), electric capacitive elements, inductor elements, and resistors.

An electronic module 100 according to the first embodiment includes the electronic device 60 mounted on the module substrate 110. In addition to the electronic device 60, other electronic devices, electronic elements, electric elements, and the like may be mounted on the module substrate 110. The module substrate 110 may be provided with an electrode 111. The electronic device 60 may be bonded to the electrode 111 with a bonding material 113, such as solder or gold-tin, provided therebetween. If the electronic device 60 includes a package, the electrode 111 of the module substrate 110 may be bonded to a wiring conductor of the package.

According to the electronic device 60 and the electronic module 100 of the first embodiment, good heat dissipation characteristics and good electrical characteristics of the electronic component 50 can be obtained, thus improving reliability.

Second Embodiment

Figure 9A:
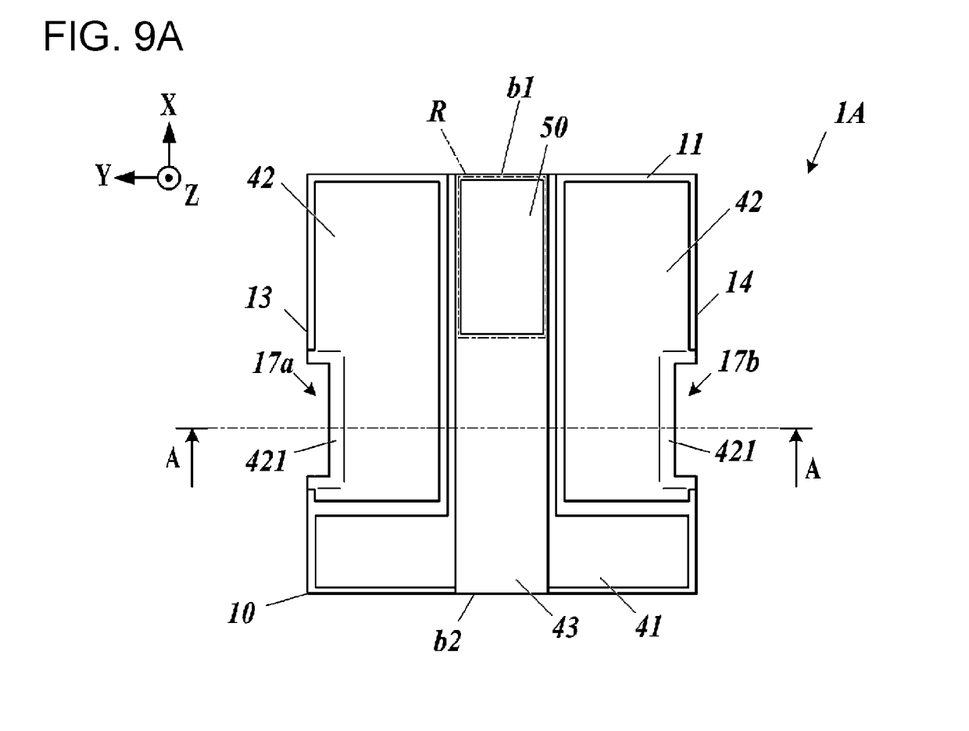
FIG. 9A is a plan view illustrating a wiring substrate, an electronic device, and an electronic module according to a second embodiment of the present disclosure.
Figure 9B:
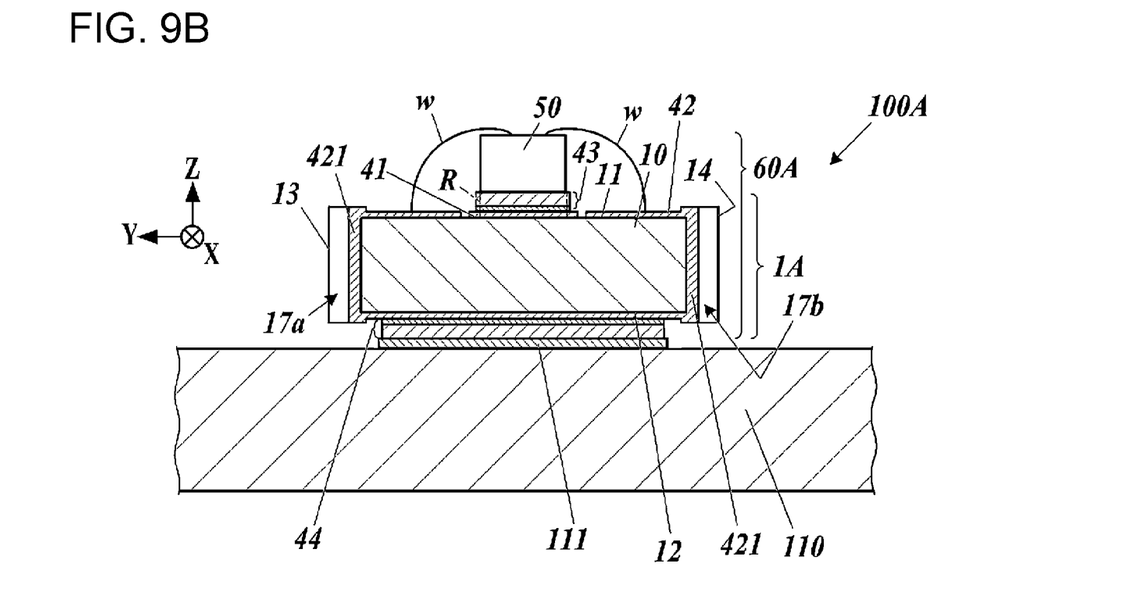
FIG. 9B is a longitudinal sectional view taken along line A-A of FIG. 9A.

FIG. 9A is a plan view illustrating a wiring substrate, an electronic device, and an electronic module according to a second embodiment of the present disclosure. FIG. 9B is a longitudinal sectional view taken along line A-A of FIG. 9A. In the following description, in FIGS. 9A and 9B, the X direction is defined as a forward direction, the Y direction is defined as a leftward direction, and the Z direction is defined as an upward direction. The directions indicated in the second embodiment may be different from the directions when the wiring substrate is in use.

A wiring substrate 1A according to the second embodiment of the present disclosure is a submount on which the electronic component (light-emitting element) 50, such as a LD, a PD, or a LED is mounted. The submount is a wiring substrate that is interposed between the electronic component 50 and the package or between the electronic component 50 and the module substrate 110, directs heat from the electronic component 50 and releases the heat to the package or module substrate 110, and passes a drive current through the electronic component 50.

The wiring substrate 1A includes the insulating substrate 10 having the first surface 11, the second surface 12 opposite to the first surface 11, a first side 13, and a second side 14 opposite to the first side 13. The first surface 11 corresponds to the upper surface, the second surface 12 corresponds to the lower surface, the first side corresponds to the left side, and the second side corresponds to the right side. The insulating substrate 10 includes groove portions 17a and 17b, which are castellations, located on the first and second sides 13 and 14, respectively. Each of the groove portions 17a and 17b extends from the first surface 11 to the second surface 12.

The first surface 11 includes a mounting portion R for the electronic component 50. The first surface 11 includes a front end (first end) b1 and a rear end (second end) b2 opposite to the front end b1 in a plan view. The mounting portion R is located closer to the front end b1 than to the rear end b2. The mounting portion R may be in contact with the front end b1. The mounting portion R may be located at the center of the first surface 11 in the left-right direction. The maximum heat generation point of the electronic component 50 may be located at the front portion of the mounting portion R.

The groove portions 17a and 17b, which are the castellations, are located closer to the rear end b2 than to the front end b1 of the first surface 11. The groove portions 17a and 17b may be located closer to the rear end than to the front end of the insulating substrate 10 in the entire region in the thickness direction.

The wiring substrate 1A further includes a wiring conductor 41 located on the first surface 11, a wiring conductor 42 located over the first surface 11, the second surface 12, the first side 13, and the second side 14, a bonding conductor 43 located on the wiring conductor 41 on the first surface 11, and a bonding conductor 44 located on the wiring conductor 42 on the second surface 12. On the first and second sides 13 and 14, the wiring conductor 42 is located in the groove portions 17a and 17b, which are the castellations. Each of the wiring conductors 41 and 42 may be a film-like conductor and may be a conductor formed of a stack of an adhesion layer containing, for example, Ti (titanium), a barrier layer containing, for example, Pt (platinum), and a conductor layer containing, for example, Au (gold). For the wiring conductor 42, a portion of the wiring conductor 42 located on the first surface 11 corresponds to an example of the first line according to the present disclosure, a portion of the wiring conductor 42 located on the second surface 12 corresponds to an example of the second line according to the present disclosure, and a portion of the wiring conductor 42 (conductor film 421) located in each of the groove portions 17a and 17b corresponds to an example of the third line according to the present disclosure.

The wiring conductor 41 is located in a region overlapping the mounting portion R on the first surface 11. The wiring conductor 41 may extend from the vicinity of the front end to the vicinity of the rear end of the first surface 11, may extend from the vicinity of the left end to the vicinity of the right end near the rear end of the first surface 11, and may have an inverted T-shape in a view from above.

The wiring conductor 42 is separated from the wiring conductor 41 on the first surface 11. The wiring conductor 42 is located on the first surface 11 and the second surface 12 as a conductor film. The wiring conductor 42 further includes the conductor films 421 that are thicker than the conductor films located on the first surface 11 and the second surface 12 and that are located in the groove portions 17a and 17b. The conductor films 421 can be thickened by performing plating of a conductor, such as Au, on the conductor films that have been formed in the groove portions 17a and 17b and that have been formed together with the conductor films on the first surface 11 and the second surface 12.

The bonding conductors 43 and 44 may be formed of a stack of a barrier layer containing, for example, Pt and a conductor layer of, for example, AuSn (gold-tin). The bonding conductor 43 on the upper surface is located on the mounting portion R on the wiring conductor 41 and bonded to the electronic component 50. The bonding conductor 43 may extend from the front end b1 to the rear end b2 of the first surface 11 beyond the mounting portion R. The bonding conductor 44 on the lower surface is located on the wiring conductor 42 (in contact with the lower surface of the wiring conductor 42) and is bonded to the electrode 111 of the package or module substrate 110.

The maximum width (for example, front-to-rear width) of the insulating substrate 10 in a planar direction along the first surface 11 is greater than the average thickness in the direction perpendicular to the first surface 11 (thickness direction). For example, the first surface 11 is a square or near-square rectangle having an area of 0.01 cm$^2$ to 1.00 cm$^2$ and a thickness of 0.1 mm to 0.8 mm.

Figure 10:
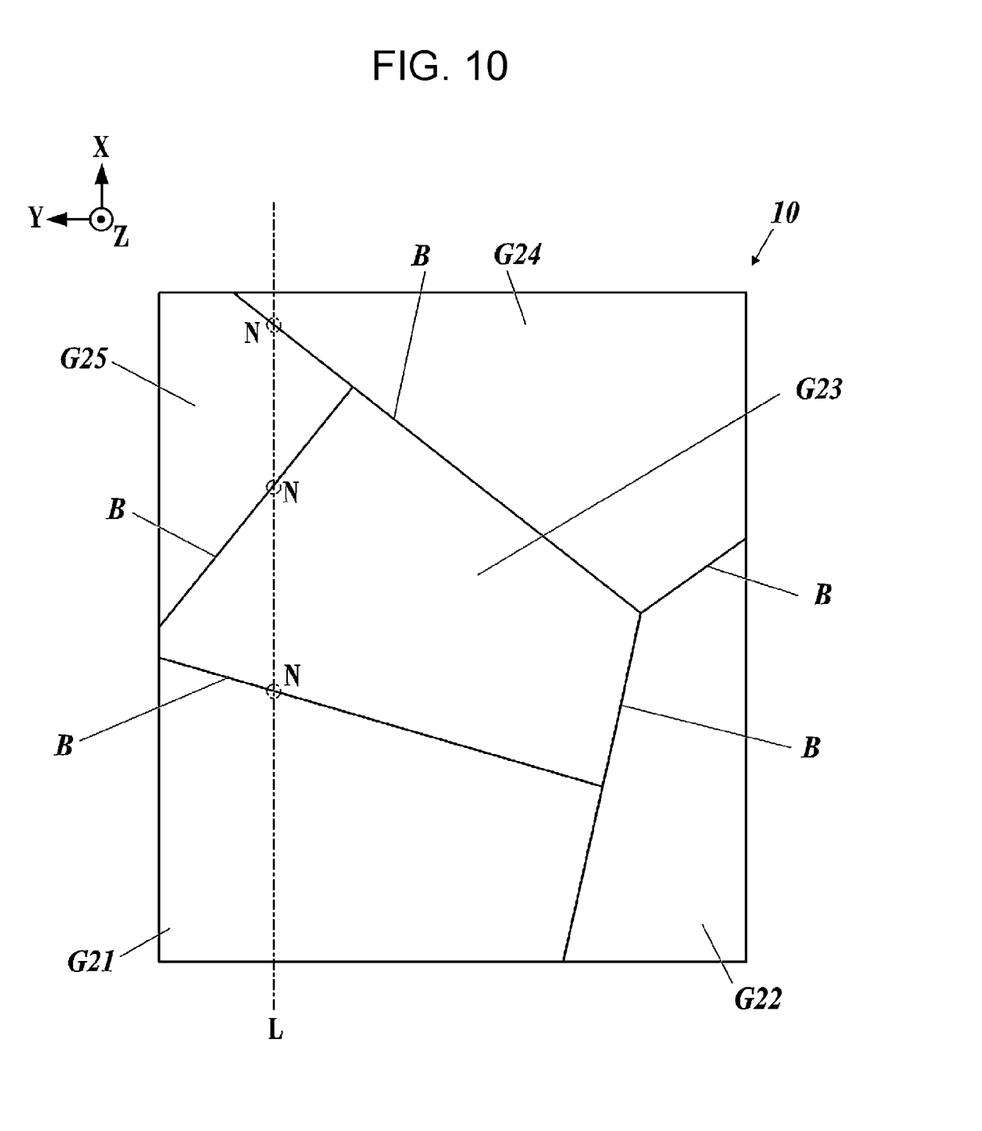
FIG. 10 is an image drawing illustrating a first surface of an insulating substrate according to the second embodiment.

FIG. 10 illustrates a first surface of an insulating substrate according to the second embodiment.

The insulating substrate 10 is a polycrystalline SiC substrate cut to a predetermined size, as illustrated in FIG. 4, and contains multiple bulk crystallites G21 to G25, as illustrated in FIG. 10. The term "bulk crystallite" refers to a mass of a single crystal grown three-dimensionally. Between adjacent bulk crystallites G21 to G25, a grain boundary phase (for example, a phase containing a sintering aid for a ceramic substrate) is not contained, and a grain boundary B as an interfacial boundary is present.

The insulating substrate 10 may contain multiple bulk crystallites of SiC with different polytypes, as illustrated in FIG. 4. The term "polytype" refers to the type of polymorphism in which the chemical composition is identical and the atomic arrangement of the crystals is different. The multiple bulk crystallites may all belong to α-SiC. α-SiC refers to bulk crystallites other than the 3C type and is a high-purity SiC crystal. α-SiC can be formed by crystal growth at 2,000° C. or higher using a sublimation-recrystallization method. With regard to all the bulk crystallites contained in the insulating substrate 10, any of 4H-type, 6H-type, and 15R-type bulk crystallites may be contained, and the total volume fraction of the 4H-type, 6H-type, and 15R-type bulk crystallites may be 80% or more. The volume fraction of the 3C-type bulk crystallites contained in the insulating substrate 10 may be 1% or less.

The plane directions of the multiple bulk crystallites G21 to G25 may be different from each other. The term "plane direction" refers to the direction of a specific crystal plane. The bulk crystallites of different polytypes contained in the insulating substrate 10 may have different plane directions from each other. The multiple bulk crystallites of the same polytype contained in the insulating substrate 10 may have different plane directions from each other.

The insulating substrate 10 has a higher thermal conductivity in the planar direction (X and Y directions) along the first surface 11 than a thermal conductivity in the thickness direction (Z direction). The thermal conductivity in a specific direction is determined by cutting the insulating substrate 10 into cubes, for example, and measuring the thermal conductivity in a specific direction using a laser flash method.

In the insulating substrate 10, the number of grain boundaries B per unit length in the planar direction along the first surface 11 is smaller than the number of grain boundaries B per unit length in the thickness direction. In the insulating substrate 10, the number of grain boundaries B in the planar direction (for example, the number of grain boundaries B from the front end to the rear end of the insulating substrate 10) is 0 to 3. The number of grain boundaries B in a specific direction can be determined on the basis of the number of intersections N of the grain boundaries B and a virtual straight line L extending in a specific direction on the surface or a section of the insulating substrate 10, as illustrated by a dot-dash line in FIG. 10. The number of grain boundaries B is defined as a value obtained by counting the number of intersections N of the grain boundaries B and five or more virtual lines L arranged randomly in a specific direction and in the insulating substrate 10, and averaging the total number of intersections.

<Method for Producing Insulating Substrate>

The polycrystalline SiC substrate, which is a material for the insulating substrate 10, can be produced in the same way as the polycrystalline SiC substrate K2 of the first embodiment. The insulating substrate 10 is obtained by cutting a polycrystalline SiC substrate to a predetermined size. The cutting point and the direction of cutting are determined so as to satisfy the requirement for the number of grain boundaries.

(Electronic Device and Electronic Module)

An electronic device 60A according to the second embodiment includes the electronic component 50, which is a light-emitting element, mounted on the wiring substrate 1A, as illustrated in FIG. 9B. One of the electrodes of the electronic component 50 is bonded to the bonding conductor 43 on the wiring conductor 41. The other electrode of the electronic component 50 is connected to the wiring conductor 42 on the first surface 11 through a bonding member, such as a bonding wire w.

An electronic module 100A according to the second embodiment includes the electronic device 60A mounted on the module substrate 110, as illustrated in FIG. 9B. In addition to the electronic device 60A, other electronic devices, electronic elements, electric elements, and the like may be mounted on the module substrate 110. The module substrate 110 is provided with the electrode 111, and the electronic device 60A may be bonded to the electrodes 111 with the bonding conductor 44 provided therebetween. If the electronic device 60A includes a package, the electrode 111 of the module substrate 110 may be bonded to a wiring conductor of the package.

Applying a voltage across the wiring conductors 41 and 42 of the wiring substrate 1A allows a drive current to flow to the electronic component 50, thereby causing the electronic component to emit light. The drive current flows from the wiring conductor 42 on the first surface 11 to the wiring conductor 42 on the second surface 12 through the conductor films 421, which are the castellations. Each of the conductor films 421, which are the castellations, has a small surface area and large thickness, compared with the wiring conductor 42 on the first surface 11 and the second surface 12. This eliminates the concentration of Joule heat on the wiring conductor 42 and enables the conductor films 421, which are the castellations, to be less likely to deteriorate.

When the electronic component 50 is driven, the electronic component 50 generates heat. For example, the amount of heat generated increases at the front end of the electronic component 50 where light is emitted. After the heat generated from the electronic component 50 is transferred from the bonding conductor on the mounting portion R to the first surface 11 of the insulating substrate 10 through the wiring conductor 41, the heat is transferred toward the second surface 12 (−Z direction) while spreading widely in the planar direction (±X direction and ±Y direction) along the first surface 11 in the insulating substrate 10. Heat spreads widely in the planar direction because the thermal conductivity of the insulating substrate 10 in the X and Y directions is higher than that in the Z direction. The heat transferred through the insulating substrate 10 spreads uniformly over the entire area of the second surface 12 and is released to the module substrate 110 through the wiring conductor 42 and the bonding conductor 44. The insulating substrate 10 is formed of a polycrystalline SiC substrate and thus has high thermal conductivity also in the Z direction, and the heat of the electronic component 50 can be efficiently released by the high heat dissipation effect with the addition of the above mode of thermal conduction.

As described above, according to the wiring substrate 1A of the second embodiment, the insulating substrate 10 on which the wiring conductors 41 and 42 are located is a polycrystalline SiC substrate, and the maximum width in the planar direction (X-Y direction) along the first surface 11 having the mounting portion R of the electronic component 50 is greater than the average thickness in the Z direction perpendicular to the first surface 11. Furthermore, the thermal conductivity of the insulating substrate 10 in the planar direction is higher than that in the thickness direction. Accordingly, the heat of the electronic component 50 mounted on the mounting portion R can be efficiently released owing to the high heat dissipation effect, as described above. The production cost of the polycrystalline SiC substrate can be suppressed as compared with the single-crystal SiC substrate; thus, the wiring substrate 1A can be produced at low cost.

According to the wiring substrate 1A of the second embodiment, the number of the grain boundaries B per unit length in the planar direction in the insulating substrate 10 is smaller than the number of the grain boundaries B per unit length in the thickness direction. The grain boundaries B have the effect of decreasing the thermal conductivity. By controlling the number of the grain boundaries B generated and the direction in which the grain boundaries B are easily formed during the production of the polycrystalline SiC substrate, the insulating substrate 10 with characteristics where the thermal conductivity in the planar direction is higher than the thermal conductivity in the thickness direction can be easily produced at low cost.

According to the wiring substrate 1A of the second embodiment, the number of the grain boundaries B in the planar direction of the insulating substrate 10 is 0 to 3. At this number, it is possible to produce the wiring substrate 1A having high heat dissipation performance while maintaining low production cost of the insulating substrate 10.

According to the wiring substrate 1A of the second embodiment, the castellations (groove portions 17a and 17b and conductor films 421) are located closer to the rear end b2 than to the front end b1 of the first surface 11, although the mounting portion R on which the electronic component 50 is mounted is located closer to the front end b1 than to the rear end b2 of the first surface 11. Since the heat of the electronic component 50 is transmitted in the thickness direction while spreading in the planar direction in the insulating substrate 10, the larger volume of the insulating substrate 10 near the heat generation point leads to an improvement in heat dissipation performance. The castellations provide the effect of reducing the volume of the insulating substrate 10 by means of the groove portions 17a and 17b, but the above arrangement allows regions that reduce the volume of the insulating substrate 10 to be separated from the mounting portion R. Thus, the heat dissipation performance of the wiring substrate 1A due to the reduction in the volume of the insulating substrate 10 caused by the castellations is less likely to deteriorate.

According to the wiring substrate 1A of the second embodiment, the conductor films 421, which are the castellations, are thicker than the wiring conductors 41 and 42 on the first surface 11 and the wiring conductor 42 on the second surface 12. Accordingly, if the current is concentrated in the conductor films 421, which are the castellations, the Joule heat of the conductor films 421 can be reduced, thereby enabling the conductor films 421 to be less likely to deteriorate.

According to the electronic device 60A and the electronic module 100A of the second embodiment, good heat dissipation characteristics of the electronic component 50 can be obtained, thus improving reliability.

The embodiments of the present disclosure have been described above. However, the wiring substrate, the electronic device, and the electronic module of the present disclosure are not limited to the above-described embodiments. For example, although the first embodiment provides an example of a method for producing the insulating substrate for the wiring substrate, another production method by which a similar insulating substrate can be produced may be employed. In the first embodiment, an example of a wiring substrate used as a submount on which one electronic component is mounted has been described; however, the wiring substrate may also be used as a wiring board on which multiple electronic components are mounted. The type and arrangement of the wiring conductors described in the first embodiment are merely an example. In the second embodiment, the shape of the insulating substrate and the arrangement, pattern, and components of the wiring conductors located on the insulating substrate can be changed as appropriate.

INDUSTRIAL APPLICABILITY

The present disclosure can be used for wiring substrates, electronic devices, and electronic modules.

REFERENCE SIGNS LIST 1, 1A wiring substrate
10 insulating substrate
11 first surface
12 second surface
20 wiring conductor
50 electronic component
60, 60A electronic device
100, 100A electronic module
110 module substrate
B grain boundary
G1 to G7, G11 to G19, G21 to G25 bulk crystallites
P, P1 to P6 micropipe
b1 front end
b2 rear end
R mounting portion
13 first side
14 second side
17a, 17b groove portion
41 wiring conductor
42 wiring conductor (first line, second line, third line)
43, 44 bonding conductor
421 conductor film (third line)

The invention claimed is:

1. A wiring substrate, comprising:
an insulating substrate including a first surface; and
a wiring conductor located at the insulating substrate,
wherein the insulating substrate contains multiple bulk crystallites of SiC with different polytypes,
wherein the insulating substrate includes a first bulk crystallite and a second bulk crystallite adjacent to each other, and
wherein the first bulk crystallite includes a micropipe including an end portion blocked by the second bulk crystallite.

2. The wiring substrate according to claim 1, wherein
the insulating substrate contains at least any of a 4H-type bulk crystallite, a 6H-type bulk crystallite, and a 15R-type bulk crystallite, and
a total volume fraction of the 4H-type bulk crystallite, the 6H-type bulk crystallite, and the 15R-type bulk crystallite is 80% or more.

3. The wiring substrate according to claim 1,
wherein a volume fraction of 3C-type bulk crystallites is 1% or less.

4. The wiring substrate according to claim 1,
wherein the multiple bulk crystallites further include a third bulk crystallite and a fourth bulk crystallite having different plane directions from each other.

5. The wiring substrate according to claim 1,
wherein the insulating substrate further include a fifth bulk crystallite including a micropipe extending in a first direction and a sixth bulk crystallite including a micropipe extending in a second direction different from the first direction.

6. The wiring substrate according to claim 1, wherein
the insulating substrate includes a second surface opposite to the first surface, and
the insulating substrate includes a grain boundary-free portion extending from the first surface to the second surface.

7. The wiring substrate according to claim 1,
wherein the insulating substrate has a resistivity of $1\times10^3$ Ω·cm or more.

8. The wiring substrate according to claim 1, wherein
the multiple bulk crystallites further include a seventh bulk crystallite and an eighth bulk crystallite adjacent to each other, and
no grain boundary phase is present between the seventh bulk crystallite and the eighth bulk crystallite.

9. The wiring substrate according to claim 1, wherein
the wiring substrate is a submount including the wiring conductor located at the insulating substrate,
the first surface includes a mounting portion on which an electronic component serving as a light-emitting element is mounted, and
the insulating substrate has a smaller average thickness in a thickness direction than a maximum width in a planar direction along the first surface.

10. An electronic device, comprising:
the wiring substrate according to claim 1; and
an electronic component mounted on the wiring substrate.

11. A wiring substrate comprising:
an insulating substrate including a first surface; and
a wiring conductor located at the insulating substrate,
wherein the insulating substrate contains multiple bulk crystallites of SiC with different polytypes, and
wherein a number of the multiple bulk crystallites on the first surface is 2 pieces/cm² or more and 100 pieces/cm² or less.

12. A wiring substrate comprising:
an insulating substrate including a first surface; and
a wiring conductor located at the insulating substrate,
wherein the insulating substrate contains multiple bulk crystallites of SiC with different polytypes,
wherein the insulating substrate has a resistivity of $1\times10^5$ Ω·cm or more, and
wherein the insulating substrate has a vanadium content of $1\times10^{15}$ atoms/cm³ or more and $1\times10^{18}$ atoms/cm³ or less.

* * * * *